United States Patent
Oh et al.

(10) Patent No.: US 8,648,659 B2
(45) Date of Patent: Feb. 11, 2014

(54) DIGITAL PRE-DISTORTION POWER AMPLIFYING APPARATUS AND METHOD FOR DIGITALLY CONTROLLING SYNCHRONIZATION THEREOF

(75) Inventors: Jung-Hoon Oh, Daejeon (KR);
Joon-Hyung Kim, Daejeon (KR);
Gweon-Do Jo, Daejeon (KR);
Young-Hoon Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 140 days.

(21) Appl. No.: 13/329,824

(22) Filed: Dec. 19, 2011

(65) Prior Publication Data

US 2012/0154036 A1    Jun. 21, 2012

(30) Foreign Application Priority Data

Dec. 21, 2010  (KR) .................. 10-2010-0131578

(51) Int. Cl.
*H03F 1/26*   (2006.01)

(52) U.S. Cl.
USPC ............ 330/149; 330/127; 330/285; 330/136

(58) Field of Classification Search
USPC ................................. 330/149, 127, 285, 136
See application file for complete search history.

(56) References Cited

U.S. PATENT DOCUMENTS

| | | | |
|---|---|---|---|
| 6,774,719 B1 * | 8/2004 | Wessel et al. | 330/136 |
| 6,987,851 B1 * | 1/2006 | Toumani et al. | 379/399.01 |
| 7,091,779 B2 * | 8/2006 | Sahlman | 330/149 |
| 7,602,244 B1 * | 10/2009 | Holmes et al. | 330/149 |
| 2002/0094795 A1 * | 7/2002 | Mitzlaff | 455/245.1 |
| 2012/0262232 A1 * | 10/2012 | Sukegawa et al. | 330/127 |

FOREIGN PATENT DOCUMENTS

KR    1020090089980 A    8/2009

OTHER PUBLICATIONS

Jinseong Jeong et al., "Wideband Envelope Tracking Power Amplifier with Reduced Bandwidth Power Supply Waveform", IMS, 2009, pp. 1381-1384, IEEE.

* cited by examiner

*Primary Examiner* — Patricia Nguyen

(57) ABSTRACT

A digital pre-distortion (DPD) power amplifying apparatus and a method for digitally controlling synchronization of the DPD power amplifying apparatus, which includes a power amplifier, a bias shifter and a DPD unit, are provided. The method includes acquiring a DPD path delay time at a path along which an input signal is fed back to the DPD unit; delaying an input signal incoming to the power amplifier by the DPD path delay time and acquiring synchronization by delaying a bias signal a predetermined number of times until the bias signal and the delayed input signal are synchronized with each other; and in response to synchronization between the bias signal and the delayed input signal being established, pre-distorting the input signal according to a feedback signal output from the power amplifier.

20 Claims, 12 Drawing Sheets

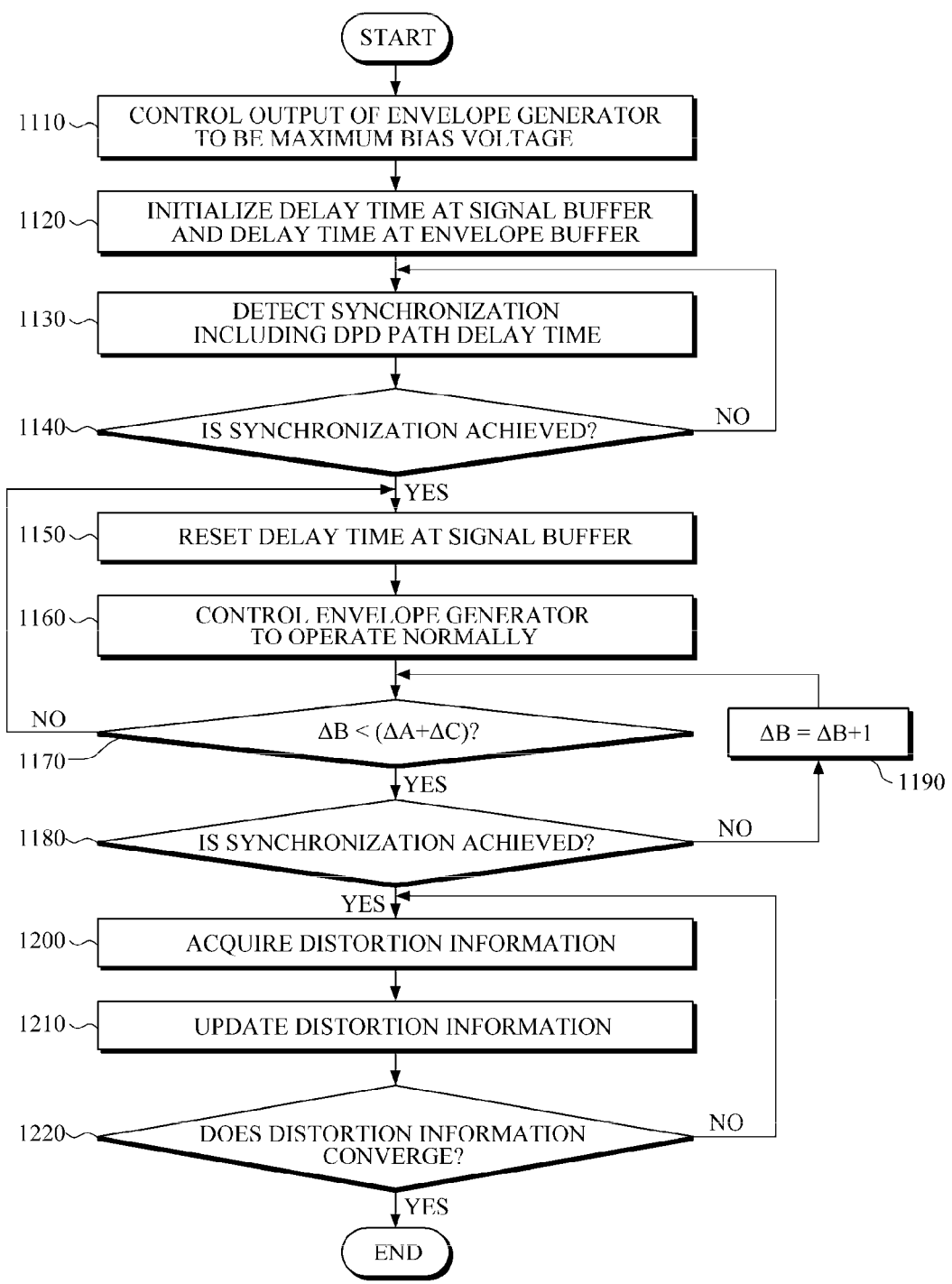

US 8,648,659 B2

DIGITAL PRE-DISTORTION POWER AMPLIFYING APPARATUS AND METHOD FOR DIGITALLY CONTROLLING SYNCHRONIZATION THEREOF

CROSS-REFERENCE TO RELATED APPLICATION(S)

This application claims the benefit under 35 U.S.C. §119 (a) of Korean Patent Application No. 10-2010-0131578, filed on Dec. 21, 2010, in the Korean Intellectual Property Office, the entire disclosure of which is incorporated herein by reference for all purposes.

BACKGROUND

1. Field

The following description relates to a wireless communication system, and more particularly, to a power amplifier to amplify and output an output signal of a wireless communication system.

2. Description of the Related Art

A wireless communication system amplifies a radio-frequency (RF) signal using a power amplifier (PA) prior to transmission over an antenna and outputs the amplified RF signal.

A power amplifier amplifies an incoming RF signal according to a bias voltage and outputs the amplified RF signal through an antenna. In amplifying an RF signal, to prevent heat loss due to a difference between a voltage of a signal output from the antenna and a fixed bias voltage, an envelope tracking (ET) power amplifier is used. The ET power amplifier shifts a bias voltage level according to the change in the amplitude of an input RF signal.

As described above, although the ET power amplifier is more advanced in efficiency than a fixed-bias-type power amplifier, there may be a problem that distortion may occur due to data loss when a power amplifier bias signal and an input RF signal of the power amplifier are not synchronized with each other.

SUMMARY

The following description relates to an apparatus and method for preventing signal loss due to inconsistent synchronization of an envelope tracking (ET) power amplifier.

The present invention provides an apparatus and method for easily controlling synchronization of an ET power amplifier.

The present invention provides an apparatus and method for controlling synchronization to quickly respond to the change in an environment of an ET power amplifier.

The present invention provides an apparatus and method for reducing data distortion due to nonlinearity of an ET power amplifier.

In one general aspect, there is provided a digital pre-distortion (DPD) power amplifying apparatus including: a power amplifier configured to amplify an input signal to be wirelessly output through an antenna and output the amplified input signal; a bias shifter configured to shift a voltage of a bias signal according to amplitude of the input signal incoming to the power amplifier and output the resultant bias signal; and a digital pre-distortion (DPD) unit configured to control synchronization between the input signal incoming to the power amplifier and the bias signal by controlling a delay time of the input signal and a delay time of the bias signal in a digital fashion.

In another general aspect, there is provided a method for digitally controlling synchronization of a power amplifying apparatus which comprises a power amplifier, a bias shifter configured to control a voltage level of a bias signal according to amplitude of an input signal output from the power amplifier and output the resultant bias signal and a digital pre-distortion (DPD) unit configured to pre-distort an input signal to be input to the power amplifier, the method including: acquiring a digital pre-distortion (DPD) path delay time at a path along which an input signal is fed back to the DPD unit; delaying the input signal incoming to the power amplifier by the DPD path delay time and acquiring synchronization by delaying the bias signal a predetermined number of times until the bias signal and the delayed input signal are synchronized with each other; and in response to synchronization between the bias signal and the delayed input signal being established, pre-distorting the input signal according to a feedback signal output from the power amplifier.

Other features and aspects may be apparent from the following detailed description, the drawings, and the claims.

BRIEF DESCRIPTION OF THE DRAWINGS is FIG. 1 is a diagram illustrating an example of a general power amplifier for use in a wireless system.

FIG. 11 is a flowchart illustrating an example of a method for digitally controlling synchronization of a digital pre-distortion power amplifying apparatus.

Figure 1:
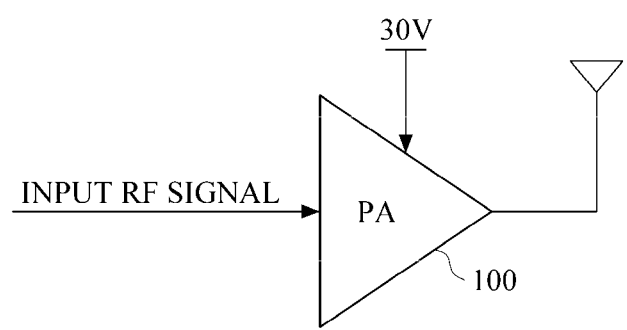

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

The present invention relates to an apparatus and method for achieving synchronization and preventing data distortion by applying a digital pre-distortion (DPD) technique to an envelope tracking (ET) power amplifier.

FIG. 1 is a diagram illustrating an example of a general power amplifier for use in a wireless system. Referring to FIG. 1, power amplifier 100 amplifies an input radio frequency (RF) signal according to a bias voltage and outputs the amplified RF signal through an antenna. In this case, regardless of the input RF signal of the power amplifier 100 varying, a power amplifier bias voltage is fixed to a maximum value, for example, 30 V. Accordingly, due to a difference between a voltage of a signal output from the antenna and the fixed bias voltage, heat loss occurs.

Figure 2:
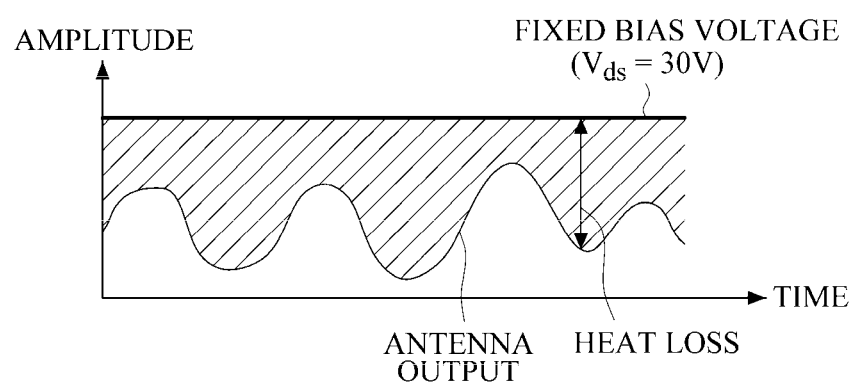
FIG. 2 is a graph showing the amplitude of an antenna output signal voltage and a bias voltage of the power amplifier illustrated in FIG. 1.

FIG. 2 is a graph showing the amplitude of an antenna output signal voltage and a bias voltage of the power amplifier illustrated in FIG. 1. As shown in FIG. 2, a portion corresponding to a difference between the amplitude of the power amplifier bias voltage and the amplitude of the antenna output signal voltage is lost as heat.

Figure 3:
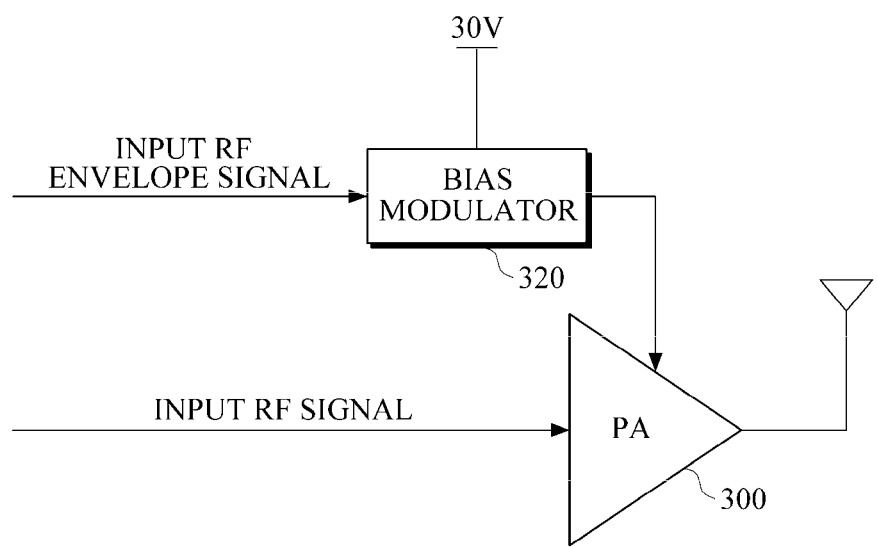
FIG. 3 is a diagram illustrating an example of a configuration of a general ET power amplifier.

To overcome the above drawbacks, an envelope tracking (ET) power amplifier has been suggested. FIG. 3 is a diagram illustrating an example of a configuration of a general ET power amplifier.

Referring to FIG. 3, power amplifier 300 includes a bias modulator 320. The bias modulator 320 shifts a bias voltage at the power amplifier 300 according to the change in the amplitude of an input RF signal.

Figure 4:
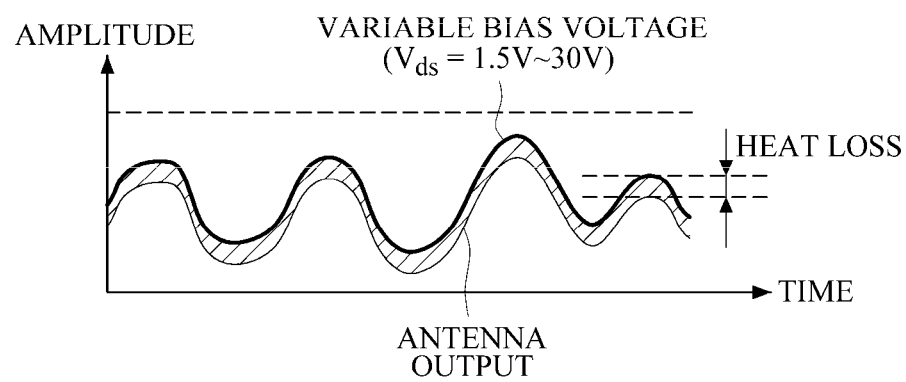
FIG. 4 is a graph showing the amplitude of an antenna output signal voltage and a bias voltage of the ET power amplifier illustrated in FIG. 3.

FIG. 4 is a graph showing the amplitude of an antenna output signal voltage and a bias voltage of the ET power amplifier illustrated in FIG. 3.

Referring to FIG. 4, the ET power amplifier bias voltage changes in a similar pattern as the antenna output signal voltage. Thus, heat loss of the ET power amplifier is appreciably reduced compared to the general power amplifier as illustrated in FIG. 2.

However, although the ET power amplifier is superior in efficiency to a fixed-bias type power amplifier, distortion may occur due to transmission data loss if a power amplifier bias signal is not synchronized with an input RF signal of the power amplifier. That is, if the input RF signal is faster or slower than the bias signal of the power amplifier, there may be a bias voltage that drops below a voltage of an antenna output signal which results from amplifying the input RF signal, and data loss may occur at the dropping bias voltage.

Figure 5:
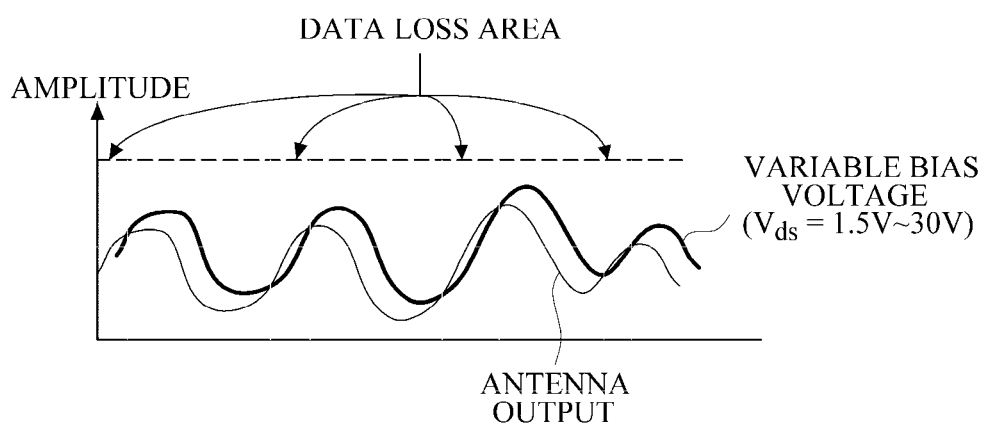
FIG. 5 is a diagram illustrating an example of data loss areas of the ET power amplifier illustrated in FIG. 3.

FIG. 5 is a diagram illustrating an example of data loss areas of the ET power amplifier illustrated in FIG. 3.

Referring to FIG. 5, the example assumes that an antenna output signal is slower than a bias signal of the power amplifier, and there are data loss areas.

Figure 6:
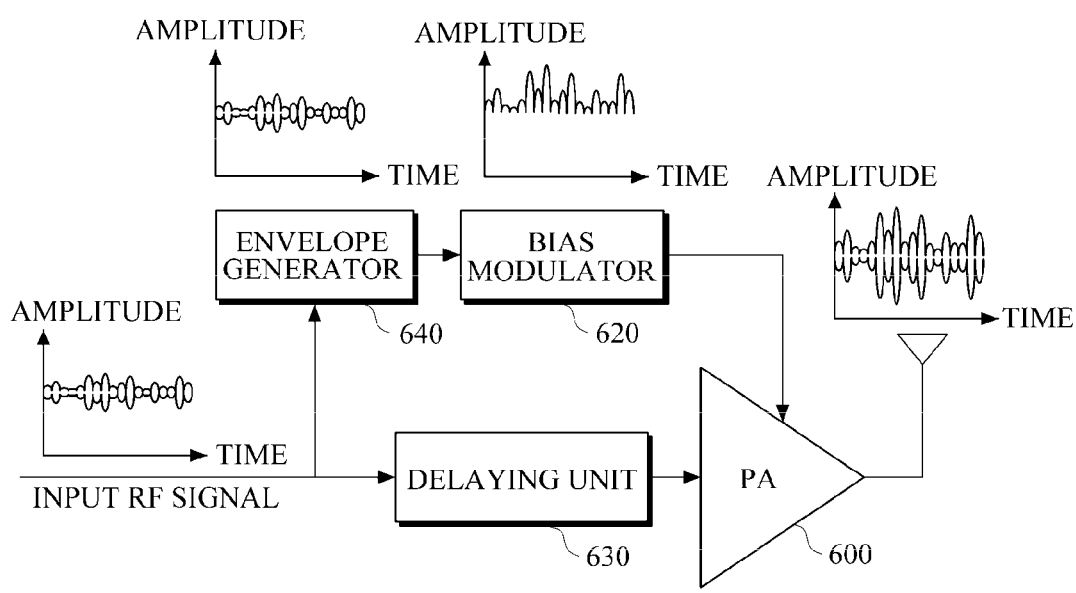
FIG. 6 is a diagram illustrating an example of a configuration of an EP power amplifier for analog synchronization control.

To overcome signal distortion due to inconsistent synchronization, a synchronization control may be performed using a configuration as shown in FIG. 6.

FIG. 6 is a diagram illustrating an example of a configuration of an EP power amplifier for analog synchronization control.

As shown in FIG. 6, a delay unit 630 is added to delay an input RF signal, thereby synchronizing an antenna output signal with a bias signal.

However, the example illustrated in FIG. 6 requires a substantial amount of effort and time to process and synchronize analog signals. In addition, the synchronization needs to be adjusted according to the change in an environment, for example, change in temperature, due to the system operation.

Hence, the present invention allows a digital pre-distortion (DPD) unit to control the synchronization, and thereby the synchronization control can be performed on digital signals.

First, a technology for correcting a distorted signal from a power amplifier using DPD is described for assisting in understanding the present invention.

Figure 7:
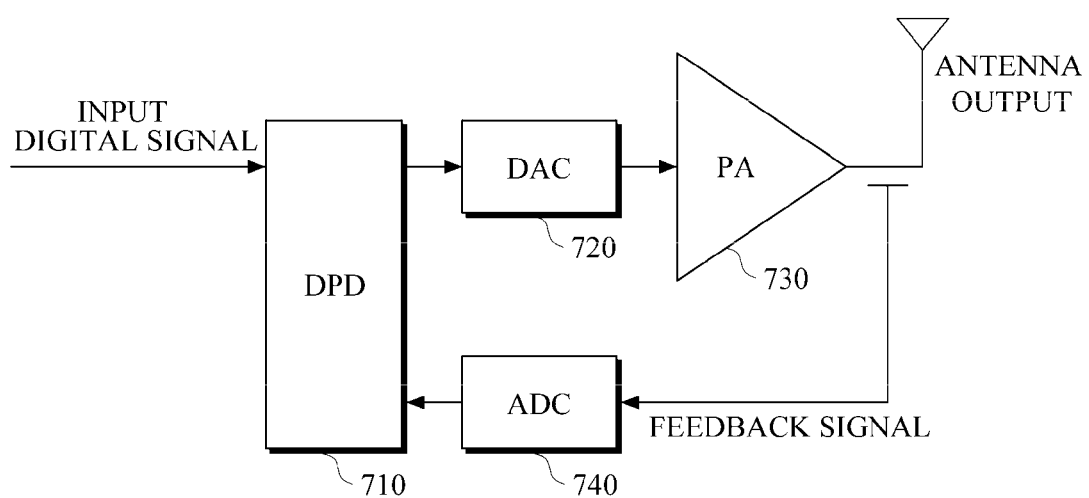
FIG. 7 is a diagram illustrating an example of a configuration of a general power amplifier which is applied DPD to improve nonlinearity.

FIG. 7 is a diagram illustrating an example of a configuration of a general power amplifier which is applied DPD to improve nonlinearity.

Referring to FIG. 7, DPD unit 710 may measure the degree of distortion by comparing an incoming digital signal and a signal that is fed back from an output signal from a power amplifier 730, pre-distort the incoming digital signal according to the measured degree of distortion, and output the pre-distorted digital signal to the power amplifier 730. That is, the incoming digital signal is pre-distorted as much as the signal output from the power amplifier 730, and thus the nonlinearity of a signal output through an antenna can be prevented. In this case, since the DPD unit 710 processes a digital signal, an analog-to-digital converter (ADC) 740 to convert a feedback signal into a digital signal and a digital-to-analog converter (DAC) 720 to convert the digital signal output from the DPD unit 710 into an analog signal that can be input to the power amplifier 730 are provided.

Figure 8A:
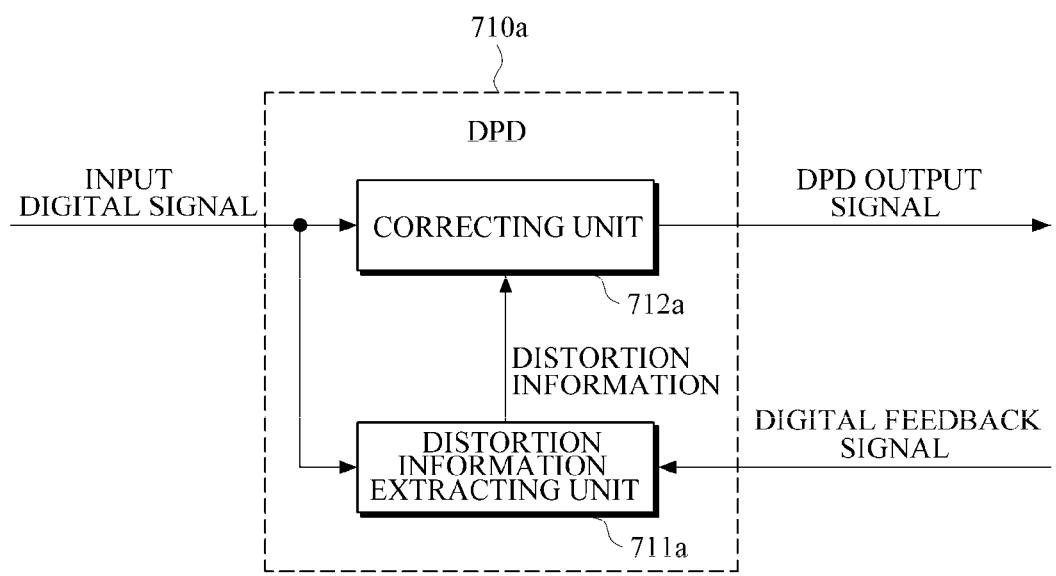
FIG. 8A is a diagram illustrating an example of a direct-mode DPD unit.
Figure 8B:
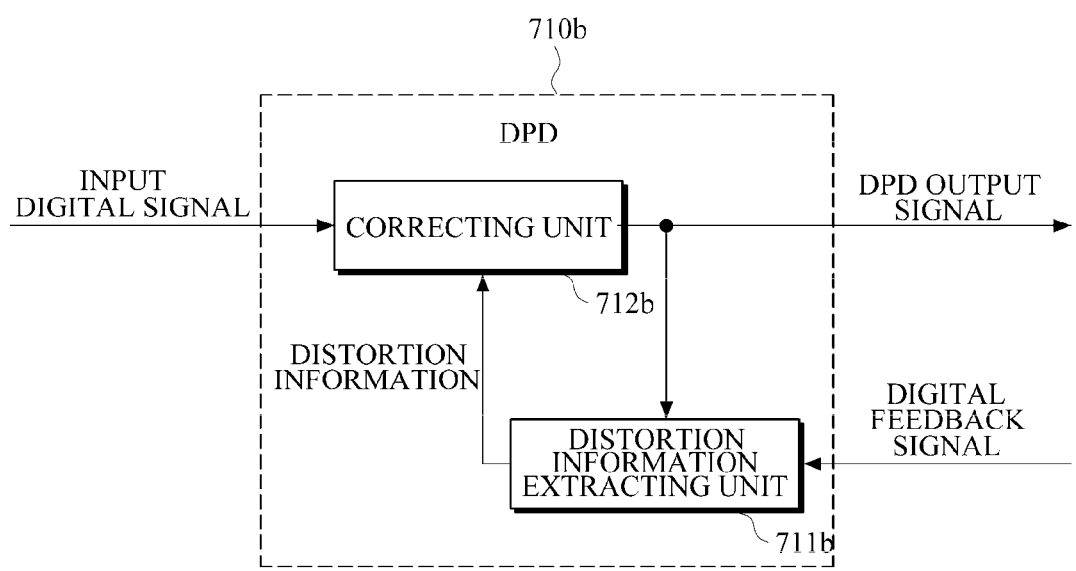
FIG. 8B is a diagram illustrating an example of an indirect-mode DPD unit.

Moreover, the DPD unit 710 may be configured in two ways as shown in FIGS. 8A and 8B.

FIG. 8A is a diagram illustrating an example of a direct-mode DPD unit, and FIG. 8B is a diagram illustrating an example of an indirect-mode DPD unit.

Referring to FIGS. 8A and 8B, the DPD unit 710a may include a distortion information extracting unit 711a and a correcting unit 712a and the DPD unit 710b may include a distortion information extracting unit 711b and a correcting unit 712b. Each of the distortion information extracting units 711a and 711b may extract distortion information according to a digital feedback signal from an output of a power amplifier 730, and each of the correcting units 711b and 712b may pre-distort a subsequently input digital signal based on the extracted distortion information. The distortion information extracting unit 712a as shown in FIG. 8A may extract the distortion information by comparing an input digital signal and the digital feedback signal, whereas the distortion information extracting unit 712b as shown in FIG. 8B may extract the distortion information by comparing a pre-distorted digital signal output from the correcting unit 712b and the digital feedback signal.

Hereinafter, an ET power amplifier employing the above DPD unit according to an exemplary embodiment of the present invention will be described.

Figure 9:
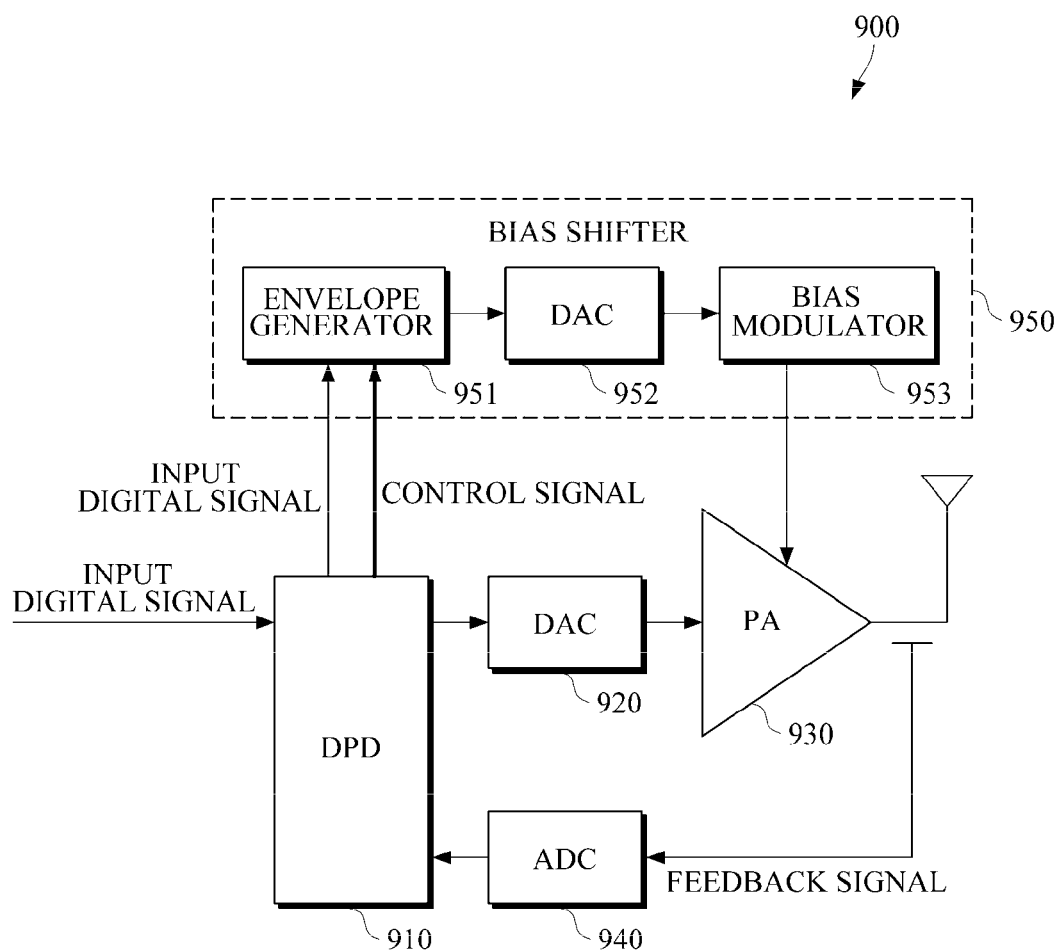
FIG. 9 is a diagram illustrating an example of a configuration of a power amplifying apparatus employing a DPD technology in a wireless communication system.

FIG. 9 is a diagram illustrating an example of a configuration of a power amplifying apparatus employing a DPD technology in a wireless communication system.

Referring to FIG. 9, power amplifying apparatus may include a power amplifier 930, a bias shifter 950, and a DPD unit 910. The power amplifier 930 may amplify an input signal to be transmitted through an antenna and output the amplified signal. The bias shifter may shift a voltage level of a bias signal according to the amplitude of the input signal. The DPD unit 910 may control the synchronization between the input signal and the bias signal by digitally adjusting a delay time between the input signal and the bias signal.

In addition, to process pre-distortion and synchronization control of digital signals of the power amplifier 930, the ADC 940 may convert a signal which is fed back from the power amplifier 930 into a digital signal and output the converted digital signal to the DPD unit 910, and the DAC 920 may convert the pre-distorted signal output from the DPD unit 910 into an analog signal that can be input to the power amplifier 950 and output the converted analog signal.

The bias shifter 950 may include an envelope generator 951, a DAC 952, and a bias modulator 953.

The envelope generator 951 may generate and output the amplitude of a digital signal output from the DPD unit 910. The DAC 952 may convert the amplitude of the digital signal output from the envelope generator 951 into an analog signal and output the converted analog signal. The bias modulator 953 may shift the bias voltage according to the analog signal output from the DAC 952, and output the shifted bias voltage to the power amplifier 930.

The DPD 910 may primarily perform two functions. First, the DPD 910 measures a degree of distortion of the power amplifier by comparing a feedback signal from the power amplifier 930 and an input digital signal, and pre-distorts a subsequently input digital signal to improve nonlinearity. Second, the DPD unit 910 controls synchronization between a bias signal of the power amplifier 930 and the input digital signal.

Figure 10:
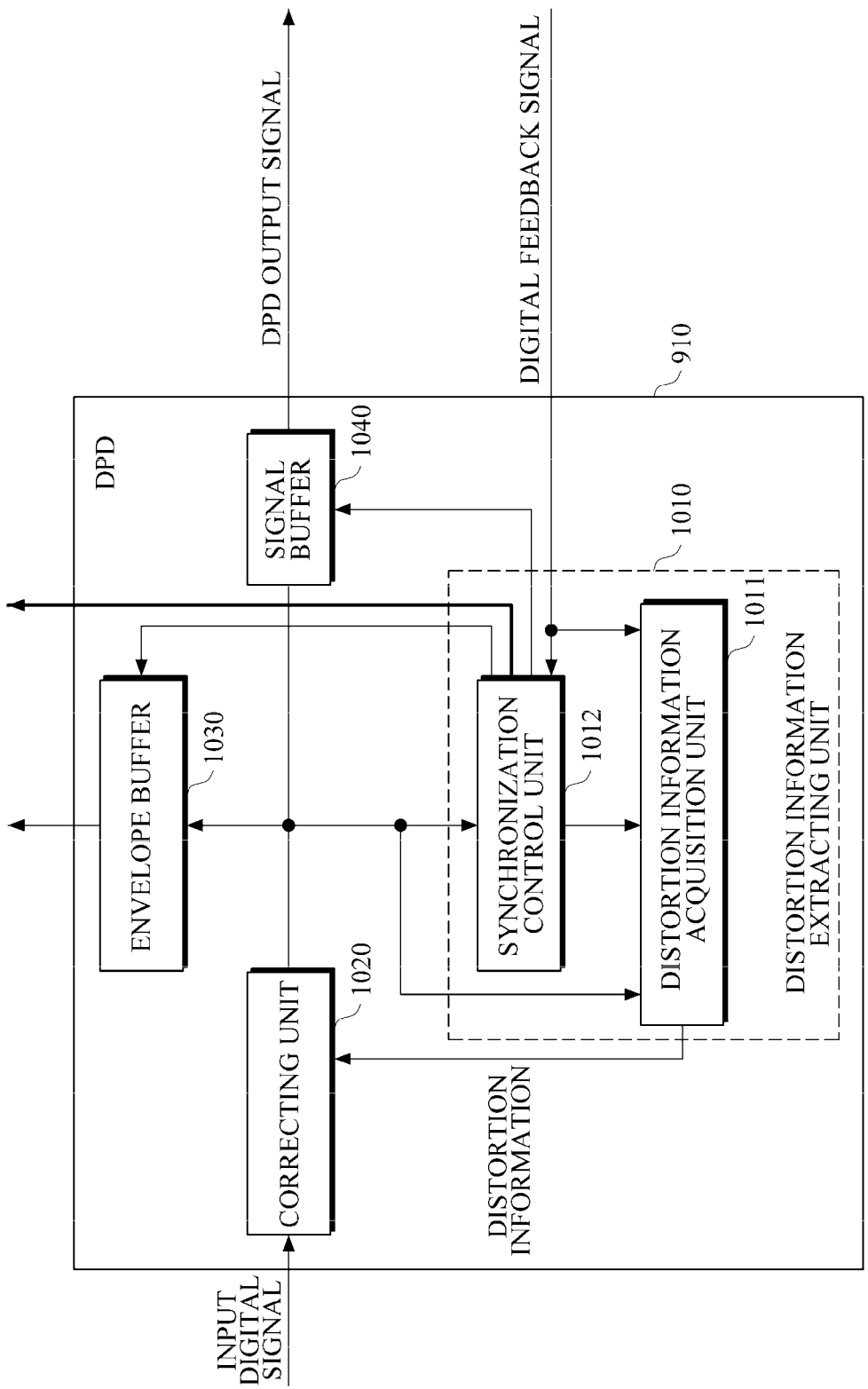
FIG. 10 is a diagram illustrating an example of a configuration of a DPD unit.

FIG. 10 is a diagram illustrating an example of a configuration of a DPD unit. The example illustrated in FIG. 10 is an indirect-mode DPD unit for convenience of explanation, and it should be appreciated that a direct-mode DPD unit can be used as the example.

Referring to FIG. 10, DPD unit 910 may include a distortion information extracting unit 1010, a correcting unit 1020, an envelope buffer 1030, and a signal buffer 1040.

The distortion information extracting unit 1010 may include a distortion information acquisition unit 1011 and a synchronization control unit 1012. The distortion information acquisition unit 1011 may receive an input digital signal and a digital feedback signal, extract distortion information that indicates a degree of distortion of a signal, and input the extracted distortion information to the correcting unit 1020. Then, the correcting unit 1020 may pre-distort the input digital signal based on the received distortion information. In addition, the synchronization control unit 1012 may synchronize the bias signal and the pre-distorted digital signal. To this end, the DPD includes the envelope buffer 1030 and the signal buffer 1040.

The envelope buffer 1030 may delay a signal generated by the envelope generator 951 for a predetermined time under the control of the synchronization control unit 1012, and then output the delayed signal. The signal buffer 1040 may delay a signal output from the correcting unit 1020 for a predetermined time under the control of the synchronization control unit 1012, and then output the delayed signal.

The distortion information acquisition unit 1011 may extract distortion information by comparing a digital feedback signal from a power amplifier and the input digital signal in response to the synchronization control unit 1012 inputting a signal indicating the acquisition of synchronization between the input digital signal and the bias signal.

Hereinafter, the operation of the DPD unit will be described in detail in conjunction with a digital pre-distortion method described below.

FIG. 11 is a flowchart illustrating an example of a method for digitally controlling synchronization of a digital pre-distortion power amplifying apparatus.

Referring to FIG. 11, the method of controlling synchronization in a digital manner in the digital pre-distortion power amplifying apparatus may primarily include acquiring digital pre-distortion (DPD) path delay time, controlling of synchronization between a signal input to a power amplifier and a bias signal, and performing of digital pre-distortion.

Referring to FIG. 11, through operations 1110, 1120, 1130, and 1140, the DPD path delay time can be acquired.

At 1110, the synchronization control unit 1012 sets the envelope generator 951 such that a fixed maximum bias voltage is output to the power amplifier 930 regardless of the change in an input signal of the power amplifier 930. Then, the envelope generator 951 generates a signal having the same amplitude regardless of the input signal. This is to confirm a DPD path delay time by operating the power amplifier 930 without the influence of an envelope signal.

At 1120, the synchronization control unit 1012 sets a delay time $\Delta A$ at the signal buffer 1040 and a delay time $\Delta B$ at the envelope buffer 1030 to 0. Through operations 1110 and 1120, the synchronization control unit 1012 enables to confirm a delay time $\Delta C$ at a DPD path. In this case, the DPD path delay time $\Delta C$ is the sum of a delay time at the DAC 920, a delay time at the power amplifier 930, a delay time at the ADC 940, and a delay time at other feedback paths. That is, the DPD path delay time $\Delta C$ is the sum of all delay times that occur along a path along which a feedback signal of the DPD unit 910 travels.

At 1130, the synchronization control unit 1012 detects synchronization, and the detected synchronization is the DPD path delay time $\Delta C$ when the bias modulator 953 is not in operation.

At 1140, the synchronization control unit 1012 determines whether the synchronization has been acquired based on the result of detection at 1130.

Referring to FIG. 11, in response to a determination at 1140 that the synchronization has been acquired, the synchronization control unit 1012 resets the delay time $\Delta A$ at the signal buffer 1040 at 1150.

When the delay time $\Delta AB$ at the envelope buffer 1030 is smaller than the sum of the delay time $\Delta A$ at the signal buffer 1040 and the DPD path delay time $\Delta C$, that is, $\Delta B<(\Delta A+\Delta C)$, the synchronization control unit 1012 sets the delay time $\Delta A$ at the signal buffer 1040 to the DPD path delay time $\Delta C$. On the other hand, when the delay time $\Delta AB$ at the envelope buffer 1030 is equal to or greater than the sum of the delay time $\Delta A$ at the signal buffer 1040 and the DPD path delay time $\Delta C$, that is, $\Delta B \geq (\Delta A+\Delta C)$, the synchronization control unit 1012 sets the delay time $\Delta A$ at the signal buffer 1040 to integer(n)-fold of the DPD path delay time $\Delta C$. In this case, the integer, n, is a condition for proceeding to operation 1170, that is, the number of failures to achieve $\Delta B<(\Delta A+\Delta C)$. This is to acquire ET power amplifier synchronization while increasing the delay time $\Delta AB$ at the envelope buffer 1030 by making the power amplifier input signal always more delayed than the bias signal.

As described above, after the delay time at the signal buffer 1040 is reset, at 1160, the synchronization control unit 1012 controls the envelope generator 951 to operate normally. In other words, the synchronization control unit 1012 controls the bias signal input to the power amplifier 930 to vary according to the input signal.

If the synchronization acquisition is performed in this state, the bias signal happens to precede the input signal of the power amplifier due to the reset of the delay time $\Delta A$ at the signal buffer 1040, and thus the synchronization acquisition fails.

Thus, by repeating operations 1180 and 1190, the synchronization control unit 1012 gradually increases the delay time $\Delta AB$ at the envelope buffer 1030 until the synchronization acquisition is successfully performed.

However, as the delay time $\Delta AB$ at the envelope buffer 1030 is increased, there may be a case in which the delay time $\Delta AB$ at the envelope buffer 1030 is longer than the sum of the delay time ΔA at the signal buffer 1040 and the DPD path delay time ΔC. In this case, since the bias signal is more delayed than the input signal of the power amplifier, a signal distortion error may occur. Hence, to prevent such a signal distortion error from occurring, the synchronization control unit 1012 further determines whether the delay time ΔAB at the envelope buffer 1030 is smaller than the sum of the delay time ΔA at the signal buffer 1040 and the DPD path delay time ΔC, that is, ΔB<(ΔA+ΔC), at 1170.

In response to a determination at 1170 that ΔB≥(ΔA+ΔC), the synchronization control unit 1012 returns to operation 1150 and sets the delay time ΔA at the signal buffer 1040 as ΔA=n*ΔC (n: the number of error occurrences) as described above. That is, the bias signal is controlled not to be more delayed than the input signal of the power amplifier.

On the other hand, in response to a determination at 1170 that ΔB<(ΔA+ΔC), the synchronization control unit 1012 determines whether it is possible to acquire the synchronization at 1180.

In response to a determination at 1180 that the synchronization acquisition is not possible, that is, the input signal of the power amplifier is more delayed than the bias signal, the synchronization control unit 1012 delays the bias signal by increasing the delay time ΔAB at the envelope buffer 1030.

If the synchronization is established between the input signal and the bias signal in the course of gradually increasing the bias signal delay, the synchronization control unit 1012 determines that the synchronization has been achieved. Thereafter, the synchronization control unit 1012 outputs the synchronization acquisition signal to the distortion information extracting unit 1010, and in response to the reception of the synchronization acquisition signal, the distortion information extracting unit 1010 performs pre-distortion throughout operations 1200 to 1220.

The distortion information of the power amplifier 930 is extracted and the pre-distortion is performed on the input signal based on the extracted distortion information at 1200 to 1220.

Referring back to FIG. 11, at 1200, the distortion information extracting unit 1010 extracts pre-distortion information by comparing the digital feedback signal and the input digital signal while the synchronization between the digital feedback signal and the input digital signal is established. At 1210, the extracted pre-distortion information is input to the correcting unit 1020. In response to the reception of the pre-distortion information, the correcting unit 1020 pre-distorts the input digital signal based on the received pre-distortion information and outputs the pre-distorted digital signal.

At 1220, the distortion information extracting unit 1010 determines whether the pre-distortion information converges to a predetermined value based on the comparison between a value output from the power amplifier and a value of the input digital signal. In other words, the distortion information extracting unit 1010 determines whether the distortion information converges to a negligibly small value. In response to a determination at 1220 that the distortion information does not converge to the predetermined value, the distortion information extracting unit 1010 re-performs operation 1200 to acquire new distortion information, updates the newly acquired distortion information in the correcting unit 1020 in operation 1210, and re-performs operation 1220.

Through operations as described above, power amplifier synchronization acquisition can be performed on digital signals, and it is thus possible to easily implement and maintain a system. In addition, linearity of the power amplifier can be achieved by performing PDP process after the synchronization acquisition.

As described above, it is possible to improve nonlinearity of an ET power amplifier and simultaneously control the synchronization between a bias signal of the ET power amplifier and an antenna output signal in a digital fashion by digitally pre-distorting a signal of the ET power amplifier. Accordingly, it is easy to control the synchronization and it is possible to quickly respond to the change in an environment of an ET power amplifier system.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A digital pre-distortion (DPD) power amplifying apparatus comprising:
   a power amplifier configured to amplify an input signal to be wirelessly output through an antenna and output the amplified input signal;
   a bias shifter configured to shift a voltage of a bias signal according to amplitude of the input signal incoming to the power amplifier and output the resultant bias signal; and
   a digital pre-distortion (DPD) unit configured to control synchronization between the input signal incoming to the power amplifier and the bias signal by controlling a delay time of the input signal and a delay time of the bias signal in a digital fashion.

2. The DPD power amplifying apparatus of claim 1, further comprising:
   an analog-to-digital converter (ADC) configured to convert a feedback signal output from the power amplifier into a digital signal and output the converted digital signal to the DPD unit; and
   a digital-to-analog converter (DAC) configured to convert a digital signal output from the DPD unit into an analog signal which can be input to the power amplifier.

3. The DPD power amplifying apparatus of claim 1, wherein the bias shifter is further configured to comprise
   an envelope generator configured to generate a signal corresponding to a change in amplitude of an input signal incoming from the DPD unit and output the generated signal,
   a digital-to-analog converter (DAC) configured to convert the signal output from the envelope generator into an analog signal and output the converted analog signal, and
   a bias modulator configured to output the bias signal, of which the voltage is shifted according to the signal output from the DAC, to the power amplifier.

4. The DPD power amplifying apparatus of claim 1, wherein the DPD unit is further configured to comprise
   a distortion information extracting unit configured to extract distortion information of a feedback signal and
   a correcting unit configured to pre-distort an incoming signal based on the distortion information extracted by the distortion information extracting unit.

5. The DPD power amplifying apparatus of claim 3, wherein the distortion information extracting unit is further configured to extract the distortion information by comparing the input signal and the feedback signal.

6. The DPD power amplifying apparatus of claim 3, wherein the distortion information extracting unit is further configured to compare a digital pre-distortion output signal output from the correcting unit and the feedback signal.

7. The DPD power amplifying apparatus of claim 4, wherein the distortion information extracting unit is further configured to comprise a distortion information acquisition unit configured to extract the distortion information by comparing the input signal and the feedback signal and input the extracted distortion information to the correcting unit and a synchronization control unit configured to output a synchronization control signal for synchronization between the input signal and the digital pre-distortion output signal.

8. The DPD power amplifying apparatus of claim 7, wherein the DPD unit is further configured to an envelope buffer configured to delay a signal input to the bias shifter for a predetermined period of time and output the delayed signal and a signal buffer configured to delay the input signal for a predetermined period of time and output the resultant signal.

9. The DPD power amplifying apparatus of claim 8, wherein the synchronization control unit is further configured to acquire a DPD path delay time at a path along which the input signal is fed back to the DPD unit, set a delay time at the signal buffer to the DPD path delay time, and perform operation of increasing of a delay time at the envelope buffer a predetermined number of times until the input signal and the bias signal are synchronized with each other.

10. The DPD power amplifying apparatus of claim 9, wherein the synchronization control unit is further configured to set the bias shifter to output a maximum bias voltage, which has been fixed prior to the acquisition of the DPD path delay time, to the power amplifier, and initialize a delay time at the signal buffer and a delay time at the envelope buffer.

11. The DPD power amplifying apparatus of claim 9, wherein the synchronization control unit is further configured to increase a delay time at the signal buffer when the delay time at the envelope buffer is equal to or greater than the sum of the delay time at the signal buffer and the DPD path delay time.

12. The DPD power amplifying apparatus of claim 7, wherein the distortion information acquisition unit is further configured to extract the distortion information by comparing the feedback signal received from the power amplifier and an input signal in response to receiving a synchronization acquisition signal from the synchronization control unit to inform of whether the synchronization has been established between the input signal and the bias signal.

13. A method for digitally controlling synchronization of a power amplifying apparatus which comprises a power amplifier, a bias shifter configured to control a voltage level of a bias signal according to amplitude of an input signal output from the power amplifier and output the resultant bias signal and a digital pre-distortion (DPD) unit configured to pre-distort an input signal to be input to the power amplifier, the method comprising:
  acquiring a digital pre-distortion (DPD) path delay time at a path along which an input signal is fed back to the DPD unit;
  delaying the input signal incoming to the power amplifier by the DPD path delay time and acquiring synchronization by delaying the bias signal a predetermined number of times until the bias signal and the delayed input signal are synchronized with each other; and
  in response to synchronization between the bias signal and the delayed input signal being established, pre-distorting the input signal according to a feedback signal output from the power amplifier.

14. The method of claim 13, wherein the acquiring of the DPD path delay time comprises
  setting the bias shifter to output a fixed maximum bias voltage to the power amplifier,
  initializing a delay time of the input signal and a delay time of the bias signal and
  acquiring the DPD path delay time occurring at the path along which a signal that has been output from the DPD unit is fed back to the DPD unit.

15. The method of claim 13, wherein the acquiring of the synchronization comprises
  delaying the input signal incoming to the power amplifier by the DPD path delay time,
  inputting a bias signal of which a voltage level is shifted according to the amplitude of the input signal and
  delaying the bias signal a predetermined number of times until the input signal and the bias signal are synchronized with each other.

16. The method of claim 13, wherein the acquiring of the synchronization comprises increasing the delay time of the input signal when the delay time of the bias signal is equal to or greater than the sum of the delay time of the input signal and the DPD path delay time.

17. The method of claim 16, wherein the increasing of the delay time of the input signal comprises setting the delay time of the input signal to an integer-fold of the DPD path delay.

18. The method of claim 17, wherein the integer is a value equivalent to the number of times that it is determined that the delay time of the bias signal is equal to or greater than the sum of the delay time of the input signal and the DPD path delay time.

19. The method of claim 13, wherein the pre-distorting of the input signal comprises
  extracting pre-distortion information by comparing the feedback signal and the input signal in response to acquiring the synchronization and
  pre-distorting the input signal based on the acquired pre-distortion information and outputting the pre-distorted input signal.

20. The method of claim 13, further comprising:
  determining whether the pre-distortion information converges to a predetermined value,
  wherein the extracting of the pre-distortion information, the pre-distorting of the input signal and outputting of the pre-distorted input signal are repeated until it is determined that the pre-distortion information converges to the predetermined value.

* * * * *